(12) United States Patent
Wang et al.

(10) Patent No.: US 9,862,149 B2
(45) Date of Patent: Jan. 9, 2018

(54) PRINT BUREAU INTERFACE FOR THREE-DIMENSIONAL PRINTING

(71) Applicant: Microsoft Corporation, Redmond, WA (US)

(72) Inventors: Zheng Wang, Kirkland, WA (US); Kristofer Iverson, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 671 days.

(21) Appl. No.: 14/473,357

(22) Filed: Aug. 29, 2014

(65) Prior Publication Data

US 2016/0059489 A1 Mar. 3, 2016

(51) Int. Cl.
| | |
|---|---|
| *G06F 19/00* | (2011.01) |
| *B29C 67/00* | (2017.01) |
| *H04L 29/08* | (2006.01) |
| *G06F 17/50* | (2006.01) |
| *B33Y 50/00* | (2015.01) |

(52) U.S. Cl.
CPC .......... *B29C 67/0088* (2013.01); *G06F 17/50* (2013.01); *H04L 67/16* (2013.01); *B33Y 50/00* (2014.12); *G05B 2219/49023* (2013.01)

(58) Field of Classification Search
None
See application file for complete search history.

(56) References Cited

U.S. PATENT DOCUMENTS

| | | | | |
|---|---|---|---|---|
| 8,131,063 | B2* | 3/2012 | Xiao | G06K 9/00248 |
| | | | | 345/420 |
| 8,954,295 | B1* | 2/2015 | Vicknair | G06T 17/10 |
| | | | | 703/1 |
| 9,177,418 | B1* | 11/2015 | Bawden | G06T 17/20 |
| 2004/0078277 | A1 | 4/2004 | Gindlesperger | |
| 2009/0284528 | A1* | 11/2009 | Jensen | G06T 17/00 |
| | | | | 345/420 |
| 2011/0060561 | A1* | 3/2011 | Lugo | G06F 17/5009 |
| | | | | 703/1 |
| 2011/0087350 | A1 | 4/2011 | Fogel et al. | |
| 2011/0205583 | A1* | 8/2011 | Young | B29C 67/0088 |
| | | | | 358/1.15 |
| 2011/0222081 | A1 | 9/2011 | Yi et al. | |
| 2012/0105903 | A1 | 5/2012 | Pettis | |

(Continued)

OTHER PUBLICATIONS

Alex, "Hollowing, Cutaway and more", Retrieved from <<http://www.sculpteo.com/blog/2014/05/02/hollowing/>>, May 2, 2014, 3 Pages.

(Continued)

*Primary Examiner* — Adam Lee
(74) *Attorney, Agent, or Firm* — International IP Law Group, PLLC (57) ABSTRACT

The claimed subject matter includes techniques for printing a three-dimensional (3D) object. An example system includes a network interface to obtain a 3D model from a client system. The example system also includes a print bureau data collection engine to identify capabilities of a plurality of print bureaus. The example system also includes a print bureau filter to compare characteristics of the 3D model with capabilities of the plurality of print bureaus to identify a subset of the plurality print bureaus that are able to print the 3D model and send the subset to the client system via the network interface.

20 Claims, 5 Drawing Sheets

(56) References Cited

U.S. PATENT DOCUMENTS

| | | | |
|---|---|---|---|
| 2013/0095302 A1* | 4/2013 | Pettis | B29C 67/0055 428/195.1 |
| 2013/0110470 A1* | 5/2013 | Vanasse | A61F 2/30942 703/1 |
| 2013/0124155 A1* | 5/2013 | Miller | G06F 17/50 703/1 |
| 2013/0176312 A1* | 7/2013 | Schouwenburg | B29C 67/0088 345/424 |
| 2013/0297059 A1* | 11/2013 | Grifith | B29C 67/0088 700/98 |
| 2013/0310965 A1* | 11/2013 | Schouwenburg | G06F 17/50 700/119 |
| 2013/0329258 A1* | 12/2013 | Pettis | F16M 13/022 358/1.15 |
| 2014/0023996 A1 | 1/2014 | Finn et al. | |
| 2014/0025190 A1 | 1/2014 | Wu | |
| 2014/0067609 A1 | 3/2014 | Heger | |
| 2014/0074272 A1* | 3/2014 | Cowden, IV | G06F 17/50 700/97 |
| 2014/0122579 A1 | 5/2014 | Friefeld et al. | |
| 2014/0156053 A1* | 6/2014 | Mahdavi | B29C 67/0059 700/119 |
| 2014/0253541 A1* | 9/2014 | Schmidt | G06T 19/20 345/419 |
| 2014/0277664 A1* | 9/2014 | Stump | G06F 17/50 700/98 |
| 2014/0371895 A1* | 12/2014 | Sadusk | B33Y 10/00 700/98 |
| 2015/0064299 A1* | 3/2015 | Koreis | G06Q 30/0603 425/375 |
| 2015/0066439 A1* | 3/2015 | Jones | G06F 17/50 703/1 |
| 2015/0120806 A1* | 4/2015 | Lippincott | H04L 67/10 709/203 |
| 2015/0165685 A1* | 6/2015 | Klappert | B29C 67/0088 700/98 |
| 2015/0169603 A1* | 6/2015 | Klappert | G06F 17/30091 700/98 |
| 2015/0172773 A1* | 6/2015 | Klappert | H04N 21/47815 705/26.5 |
| 2015/0220291 A1* | 8/2015 | Tapley | G06F 3/1296 358/1.15 |
| 2015/0224715 A1* | 8/2015 | Badhani | B29C 67/0088 700/98 |
| 2015/0253761 A1* | 9/2015 | Nelson | G05B 19/4099 700/98 |
| 2015/0306824 A1* | 10/2015 | Flores Mangas | G05B 15/02 700/98 |
| 2016/0185047 A1* | 6/2016 | Windau | B29C 67/0088 358/406 |

OTHER PUBLICATIONS

"How to use Meshlab & Netfabb for fixing your model", Retrieved from <<http://web.archive.org/web/20100805093840/http://www.shapeways.com/tutorials/how_to_use_meshlab_and_netfabb>>, Aug. 5, 2010, 7 Pages.

"International Search Report & Written Opinion Issued in PCT Application No. PCT/US2015/046838", dated Dec. 17, 2015, 18 Pages.

"Fabnami Offers a Smart 3d Printing Platform & Web Api for Small Businesses", Published on: Apr. 25, 2014 Available at: http://www.3ders.org/articles/20140425-fabnami-offers-a-smart-3d-pirnting-platform-web-api.html.

Forrest, Conner., "How Amazon is giving 3D printing a boost with new marketplace of customizable prints", Published on: Jul. 28, 2014 Available at: http://www.techrepublic.com/article/how-amazon-is-giving-3d-printing-a-boost-with-new-marketplace-of-customizable-prints/.

Hachman, Mark, "Microsoft debuts 3D printing app for Windows 8.1", Published on: Nov. 15, 2013 Available at: http://www.pcworld.com/article/2064062/microsoft-debuts-3d-printing-app-for-windows-8-1.html.

Mathilde, "37 Marketplaces to Share, Buy and Sell Designs for 3D Printing", Published on: Jul. 11, 2013 Available at: http://makingsociety.com/2013/07/37-3d-printing-marketplaces-to-share-buy-and-sell-3d-designs/.

Taylor, Shane., "Google Enters 3D Printing Arena", Published on: Nov. 28, 2013 Available at: http://3dprintingindustry.com/2013/11/28/google-enters-3d-printing-arena/.

International Preliminary Report on Patentability for PCT Application No. PCT/US2015/046838, dated Nov. 17, 2016, 22 pages.

Written Opinion of the International Preliminary Examining Authority, for PCT Application, PCT/US2015/046838, dated Aug. 2, 2016, 13 pages.

* cited by examiner

FIG. 5

PRINT BUREAU INTERFACE FOR THREE-DIMENSIONAL PRINTING

BACKGROUND

Three-dimensional (3D) objects may be fabricated in various ways, including printing and additive manufacturing processes, such as fused filament deposition modeling wherein the printer extrudes thermal plastic through a hot nozzle. A 3D printer can create various 3D objects based on a digital representation of the object, referred to herein as a 3D model. The 3D model can be generated using a computer aided design (CAD) system or a 3D scanner, for example. The 3D model can be converted into 2-Dimensional (2D) layers of tool path information specific to the printing device. 3D print bureaus are available on the Internet today and make it possible for customers to upload 3D models, have their designs printed on industrial printers, and receive the output via postal mail.

SUMMARY

The following presents a simplified summary of the innovation in order to provide a basic understanding of some aspects described herein. This summary is not an extensive overview of the claimed subject matter. It is intended to neither identify key elements of the claimed subject matter nor delineate the scope of the claimed subject matter. Its sole purpose is to present some concepts of the claimed subject matter in a simplified form as a prelude to the more detailed description that is presented later.

An implementation provides a system for printing a three-dimensional (3D) object. The system includes a first network interface to obtain a 3D model from a client system. The system also includes a print bureau data collection engine to identify capabilities of a plurality of print bureaus. The system also includes a print bureau filter to compare characteristics of the 3D model with capabilities of the plurality of print bureaus to identify a subset of the plurality print bureaus that are able to print the 3D model and send the subset to the client system via the first network interface.

Another implementation provides a system that includes a processor and a system memory comprising code to direct the actions of the processor. The code directs the processor to obtain a 3D model from a client system and determine whether the 3D model represents a closed volume. If the 3D model does not represent a closed volume, the code directs the processor to automatically repair the 3D model to generate a modified 3D model with a closed volume.

Another implementation provides a method that includes obtaining a 3D model from a client system and comparing characteristics of the 3D model with capabilities of a plurality of print bureaus to identify a subset of the plurality print bureaus that are able to print the 3D model. The method also includes sending the subset to the client system.

The following description and the annexed drawings set forth in detail certain illustrative aspects of the claimed subject matter. These aspects are indicative, however, of a few of the various ways in which the principles of the innovation may be employed and the claimed subject matter is intended to include all such aspects and their equivalents. Other advantages and novel features of the claimed subject matter will become apparent from the following detailed description of the innovation when considered in conjunction with the drawings.

DETAILED DESCRIPTION

This disclosure describes techniques for providing 3D printing services, such as automated analysis and improvement of 3D models and connectivity with 3D printing bureaus. One of the challenges of running a 3D printing bureau is that most 3D content submitted by customers cannot actually be printed on a 3D printer. This is because 3D models most often need to be designed to be 3D printed and that expertise is beyond the average customer. There is a lot of manual back and forth communication involving email and phone calls. This results in print bureaus focusing mostly on the highest value clients and rejecting less expensive designs without much feedback to the customer.

The 3D printing services described herein provide an additional layer of processing between the design tool of the customer and the 3D printer of the printing bureau. The additional layer of processing can include verifying printability of the 3D models, analyzing and adjusting the model data to improve print quality and efficiency, converting 3D models into accepted formats, and implementing vendor specific software for transferring 3D model files to printing bureaus, among other operations. Additionally, based on various characteristics of the 3D model, the printing bureaus better able to print a particular 3D model can be identified and presented to the customer as choices. Using the techniques described herein, the 3D model will me more suitable for 3D printing by the printing bureau, and it is much more likely that the printing bureau will process the order in a manner that satisfies the customer. The printing service system described herein leads to more successful 3D printing and higher customer satisfaction by providing a consistent authentication, a common set of automatic 3D model repair and analysis engines to ensure printability, automatically correcting the things that tend to make a model printable, a set of APIs available to software application developers.

In some examples, 3D printing services described herein are provided over the Internet as a Web service, and the automatic 3D model analysis and processing provided by the Web service is performed before submission to the printing bureau. The Web service may also connect customers directly with a chosen print bureau. In some examples, the 3D printing service can also be implemented by a print bureau or on a user's computer as a feature of a 3D design tool or as a separate software application.

Figure 1:
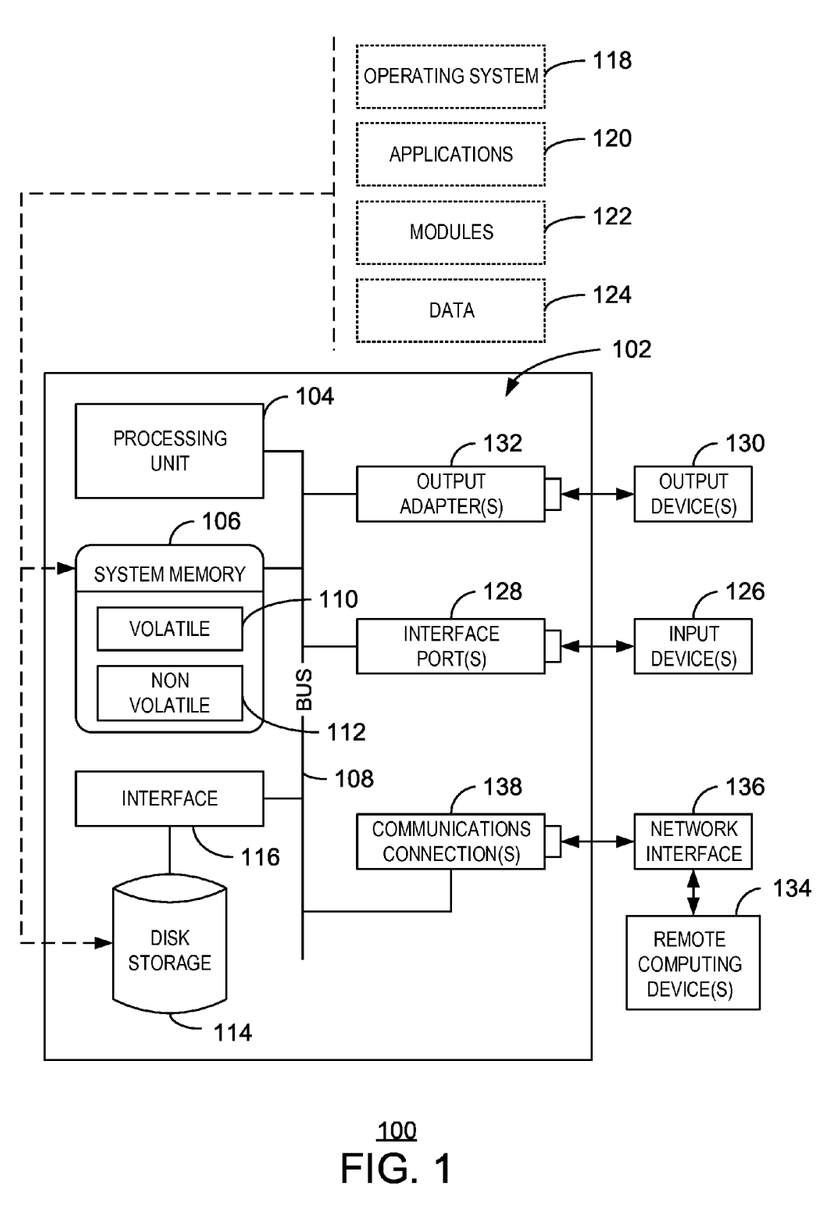
FIG. 1 is a block diagram of an example operating environment configured for implementing various aspects of the techniques described herein.

As a preliminary matter, some of the figures describe concepts in the context of one or more structural components, variously referred to as functionality, modules, features, elements, or the like. The various components shown in the figures can be implemented in any manner, such as software, hardware, firmware, or combinations thereof. In some cases, various components shown in the figures may reflect the use of corresponding components in an actual implementation. In other cases, any single component illustrated in the figures may be implemented by a number of actual components. The depiction of any two or more separate components in the figures may reflect different functions performed by a single actual component. FIG. 1, discussed below, provides details regarding one system that may be used to implement the functions shown in the figures.

Other figures describe the concepts in flowchart form. In this form, certain operations are described as constituting distinct blocks performed in a certain order. Such implementations are exemplary and non-limiting. Certain blocks described herein can be grouped together and performed in a single operation, certain blocks can be broken apart into multiple component blocks, and certain blocks can be performed in an order that differs from that which is illustrated herein, including a parallel manner of performing the blocks. The blocks shown in the flowcharts can be implemented by software, hardware, firmware, manual processing, or the like. As used herein, hardware may include computer systems, discrete logic components, such as application specific integrated circuits (ASICs), or the like.

As to terminology, the phrase "configured to" encompasses any way that any kind of functionality can be constructed to perform an identified operation. The functionality can be configured to perform an operation using, for instance, software, hardware, firmware, or the like. The term, "logic" encompasses any functionality for performing a task. For instance, each operation illustrated in the flowcharts corresponds to logic for performing that operation. An operation can be performed using, software, hardware, firmware, or the like. The terms, "component," "system," and the like may refer to computer-related entities, hardware, and software in execution, firmware, or combination thereof. A component may be a process running on a processor, an object, an executable, a program, a function, a subroutine, a computer, or a combination of software and hardware. The term, "processor," may refer to a hardware component, such as a processing unit of a computer system.

Furthermore, the claimed subject matter may be implemented as a method, apparatus, or article of manufacture using standard programming and engineering techniques to produce software, firmware, hardware, or any combination thereof to control a computing device to implement the disclosed subject matter. The term, "article of manufacture," as used herein is intended to encompass a computer program accessible from any computer-readable storage device or media. Computer-readable storage media can include, but are not limited to, magnetic storage devices, e.g., hard disk, floppy disk, magnetic strips, optical disk, compact disk (CD), digital versatile disk (DVD), smart cards, flash memory devices, among others. In contrast, computer-readable media, i.e., not storage media, may include communication media such as transmission media for wireless signals and the like.

FIG. 1 is intended to provide a brief, general description of a computing environment in which the various techniques described herein may be implemented. For example, a method and system for receiving, analyzing, and processing a 3D model to be used for fabricating 3D objects can be implemented in such a computing environment. While the claimed subject matter has been described above in the general context of computer-executable instructions of a computer program that runs on a local computer or remote computer, the claimed subject matter also may be implemented in combination with other program modules. Generally, program modules include routines, programs, components, data structures, or the like that perform particular tasks or implement particular abstract data types.

FIG. 1 is a block diagram of an example operating environment configured for implementing various aspects of the techniques described herein. The example operating environment 100 includes a computer 102. The computer 102 includes a processing unit 104, a system memory 106, and a system bus 108.

The system bus 108 couples system components including, but not limited to, the system memory 106 to the processing unit 104. The processing unit 104 can be any of various available processors. Dual microprocessors and other multiprocessor architectures also can be employed as the processing unit 104.

The system bus 108 can be any of several types of bus structure, including the memory bus or memory controller, a peripheral bus or external bus, and a local bus using any variety of available bus architectures known to those of ordinary skill in the art. The system memory 106 includes computer-readable storage media that includes volatile memory 110 and nonvolatile memory 112.

The basic input/output system (BIOS), containing the basic routines to transfer information between elements within the computer 102, such as during start-up, is stored in nonvolatile memory 112. By way of illustration, and not limitation, nonvolatile memory 112 can include read-only memory (ROM), programmable ROM (PROM), electrically programmable ROM (EPROM), electrically erasable programmable ROM (EEPROM), or flash memory.

Volatile memory 110 includes random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), SynchLink™ DRAM (SLDRAM), Rambus® direct RAM (RDRAM), direct Rambus® dynamic RAM (DRDRAM), and Rambus® dynamic RAM (RDRAM).

The computer 102 also includes other computer-readable media, such as removable/non-removable, volatile/nonvolatile computer storage media. FIG. 1 shows, for example a disk storage 114. Disk storage 114 includes, but is not limited to, devices like a magnetic disk drive, floppy disk drive, tape drive, Jaz drive, Zip drive, LS-210 drive, flash memory card, or memory stick.

In addition, disk storage 114 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 114 to the system bus 108, a removable or non-removable interface is typically used such as interface 116.

It is to be appreciated that FIG. 1 describes software that acts as an intermediary between users and the basic computer resources described in the suitable operating environment 100. Such software includes an operating system 118. Operating system 118, which can be stored on disk storage 114, acts to control and allocate resources of the computer 102.

System applications 120 take advantage of the management of resources by operating system 118 through program modules 122 and program data 124 stored either in system memory 106 or on disk storage 114. It is to be appreciated that the claimed subject matter can be implemented with various operating systems or combinations of operating systems.

A user enters commands or information into the computer 102 through input devices 126. Input devices 126 include, but are not limited to, a pointing device, such as, a mouse, trackball, stylus, and the like, a keyboard, a microphone, a joystick, a satellite dish, a scanner, a TV tuner card, a digital camera, a digital video camera, a web camera, and the like. The input devices 126 connect to the processing unit 104 through the system bus 108 via interface ports 128. Interface ports 128 include, for example, a serial port, a parallel port, a game port, and a universal serial bus (USB).

Output devices 130 use some of the same type of ports as input devices 126. Thus, for example, a USB port may be used to provide input to the computer 102, and to output information from computer 102 to an output device 130.

Output adapter 132 is provided to illustrate that there are some output devices 130 like monitors, speakers, and printers, among other output devices 130, which are accessible via adapters. The output adapters 132 include, by way of illustration and not limitation, video and sound cards that provide a means of connection between the output device 130 and the system bus 108. It can be noted that other devices and systems of devices can provide both input and output capabilities such as remote computers 134.

The computer 102 can be a server hosting various software applications in a networked environment using logical connections to one or more remote computers, such as remote computers 134. The remote computers 134 may be client systems configured with web browsers, PC applications, mobile phone applications, and the like. The remote computers 134 can be a personal computer, a server, a router, a network PC, a workstation, a microprocessor based appliance, a mobile phone, a peer device or other common network node and the like, and typically includes many or all of the elements described relative to the computer 102. Remote computers 134 can be logically connected to the computer 102 through a network interface 136 and then connected via a communication connection 138, which may be wireless.

Network interface 136 encompasses wireless communication networks such as local-area networks (LAN) and wide-area networks (WAN). LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection 138 refers to the hardware/software employed to connect the network interface 136 to the bus 108. While communication connection 138 is shown for illustrative clarity inside computer 102, it can also be external to the computer 102. The hardware/software for connection to the network interface 136 may include, for exemplary purposes, internal and external technologies such as, mobile phone switches, modems including regular telephone grade modems, cable modems and DSL modems, ISDN adapters, and Ethernet cards. An example processing unit 104 for the server may be a computing cluster. The disk storage 114 may comprise an enterprise data storage system, for example, holding thousands of impressions.

The computer 102 can be configured to implement some or all of the 3D printing services described herein. For example, the applications 120 may include applications for analyzing 3D models and modifying 3D models to improve printability and reduce print costs. The applications 120 can also include applications for identifying the capabilities of print bureaus, matching a user to a print bureau based on characteristics of the 3D model, and presenting a choice of print bureaus to a user. Some applications 120 may provide automatic conversion of customer 3D models into the accepted formats by each print bureau along with metadata used to prepare the order (options, name, country, etc). In some examples, the computer 102 may be a user's computer and the 3D printing service is implemented on the users' computer. In some examples, the computer 102 may be a computer residing at the print bureau. In some examples, the computer 102 may be a server of a Web service that provides a middleman system between the print bureaus and the print bureau's potential customers. In some examples, the 3D printing service can be provided as a cloud computing service. Features of a Web-based 3D printing service are described in more detail below. However, it will be appreciated that many of the features described below will also apply to other types of 3D printing service systems, such as services that are implemented by a print bureau or on a computer of 3D printing customer.

Figure 2:
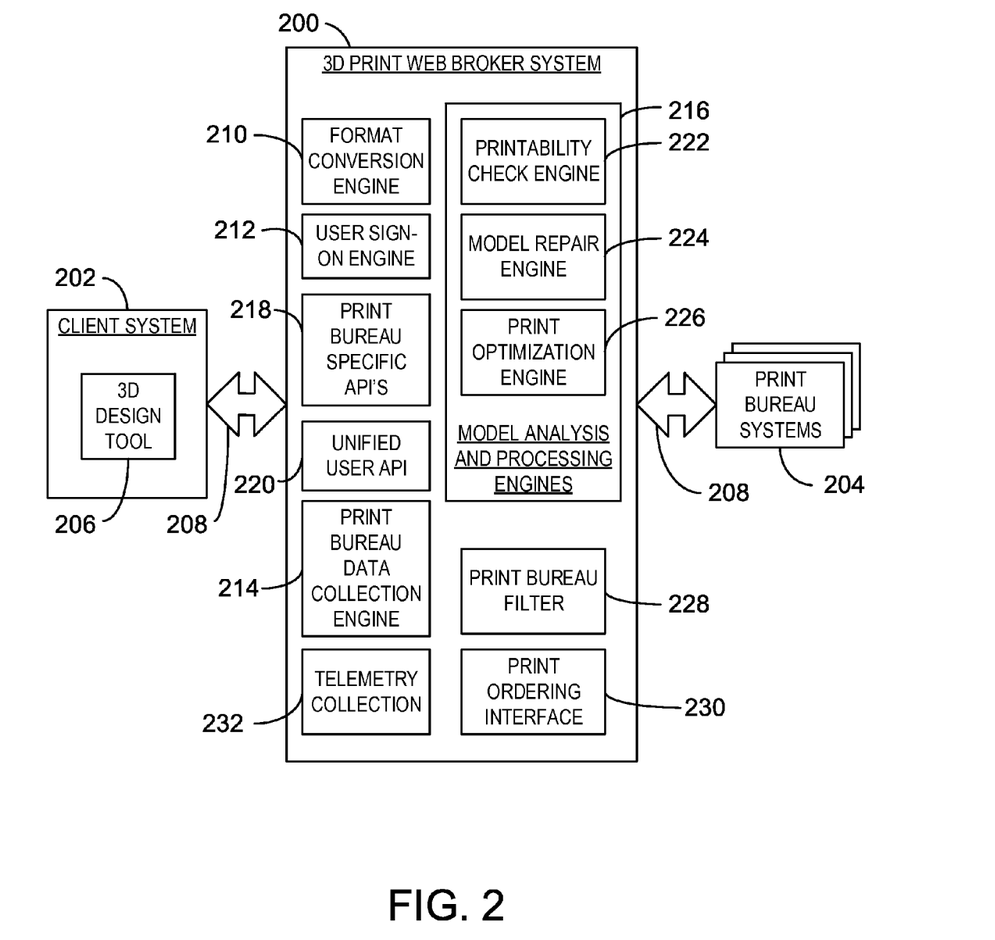
FIG. 2 is a block diagram of an example of a 3D printing service implemented as Web broker system.

FIG. 2 is a block diagram of an example of a 3D printing service implemented as Web broker system. The 3D print Web broker system 200 may be implemented on one or more computing devices, such as the computer 102 of FIG. 1. For example, the 3D print Web broker system 200 may be implemented on a single Web server or a number of servers, such as a Web service running on a cloud platform. In some examples, the Web broker system 200 is a stateless and scalable service providing a Representational State Transfer (REST) interface to the client systems 202. Other Web interfaces, such as Simple Object Access Protocol (SOAP), may also be supported. Data model files can be transferred from a client system 202 to the Web broker system 200 through HTTP protocols, and standard status codes can be returned to the client system 202. 3D model metadata, print settings, authentication and other service settings can be specified through HTTP headers and request parameters.

The 3D print Web broker system 200 is communicatively coupled to a client system 202 and one or more print bureau systems 204. The client system 202 may be any suitable electronic device, including a personal computer, laptop computer, tablet computer, and the like. The client system 202 can includes a 3D design tool 206 for generating 3D models. For example, the 3D design tool 206 can be a Computer Aided Design (CAD) software application such as 3D Builder, among others. The client system 202 can be coupled to the Web broker system 200 through any suitable network 208, including the Internet.

The print bureau systems 204 may include any suitable computer systems for communicating with customers and providing 3D printing services over the Web, such as Web servers, databases, computer workstations, and the like. Each of the print bureau systems 204 can be coupled to the Web broker system 200 through the network 208. Each print bureau system 204 provides the ability for customers to upload 3D models and order prints, for example, through a Web site. Each print bureau system 204 may also provide computer code to client systems 202, such as Application Programming Interfaces (APIs) that enables client systems 202 to connect to and communicate with print bureaus 204. Each print bureau 204 may have its own vendor specific API that it maintains and distributes.

The 3D print Web broker system 200 enables clients to submit a 3D print job and connect the client to a suitable print bureau 204. Different print bureaus 204 will generally provide different 3D printing capabilities. The Web broker system 200 can filter the list of print bureau choices based on customer specifications and characteristics of a 3D model and provide a list of print bureau choices to the client based on print bureau capabilities. The Web broker system 200 can also provide automatic analysis and modification of 3D models to ensure that the 3D models are printable and to reduce print costs.

The 3D print Web broker system 200 also simplifies the interaction between the client system and the print bureaus 204. For example, the Web broker system 200 can automatic convert 3D models provided by the client into the formats accepted by each print bureau. In some examples, the Web broker system 200 may provide single sign-on authentication, which allows users to access an operating system user interface, applications, and a print bureau system 204 with a single login credential. The Web broker system 200 also provides a standard API to client applications and eliminates the need for client systems 202 to maintain vendor specific APIs for application developers.

The 3D print Web broker system 200 can include various components, referred to herein as engines. As used herein an engine refers to a combination of computer hardware and programming. For example, the engines may be implemented as programming instructions executed by a general purpose processing unit, Application Specific Integrated Circuits (ASICs), logic circuits implemented in one or more integrated circuit devices, or software running on one or more severs, among others. In some examples, the 3D print Web broker system 200 can include a format conversion engine 210, user sign-on engine 212, a print bureau data collection engine 214, and one or more model analysis and processing engines 216.

The format conversion engine 210 can translate a 3D model received from a client system 202 into an accepted format used by each of the print bureaus. For example, the format conversion engine 210 may translate a 3D model from 3D Manufacturing Format (3MF) to Virtual Reality Modeling Language (VRML) or from STereoLithography (STL) to OBJ.

The user sign-on engine 212 can provide a single sign-on authentication that enables client to access several print bureau systems 204 systems with a single login credential. Each print bureau system 204 may require a login credential, referred to herein as a login token, that enables a user to login to the print bureau system 204. Each print bureau may have different rules for the type of credentials required from users. Rather than providing a different login credential to each print bureau system 204 separately, the user can provide a single log-in credential to the 3D print Web broker system 200. If the user is authenticated, the user sign-on engine 212 can convert the validated user credentials into login tokens used to login to corresponding print bureau systems 204. The single sign-on can also be used to login to other applications such as an operating system user interface.

The print bureau data collection engine 214 can be used to collect information from the print bureau systems 204. Examples of information collected by the print bureau data collection engine 214 include pricing information, accepted 3D model formats, 3D printer capabilities, geographical location of the printer, and other information. In some examples, the information is collected from the print bureau systems 204 through sources that are publicly available, such as Web pages of the print bureau service 204. In some examples, the print bureaus are configured to provide special access to the collected data. For example, each print bureau system 204 may be configured to respond to queries received from the Web broker system 200.

The print bureau data collection engine 214 uses print bureau specific APIs 218 to obtain print bureau specific information from each of the print bureau systems 204. When interacting with a specific print bureau system 204, the Web broker system 200 may use the print bureau specific API 218 corresponding to that print bureau system 204. Each print bureau may also have an API that is part of the print bureau system and is configured to communicate with the print bureau specific API 218. To maintain the print bureau specific APIs 218, the Web broker system 200 may receive vendor specific updates from each of the print bureau systems 204. Interactions between the client system 202 and the Web broker system 200 may be controlled by the unified user API 220, which can interface with each of the print bureau APIs 218. In this way, the client system 202 can maintain only one API rather than one for each print bureau system 204.

The model analysis and processing engines 216 can be used to analyze and modify 3D models submitted by clients. The model analysis and processing engines 216 can include a printability check engine 222, model repair engine 224, and a print optimization engine 226.

In order for a 3D model to be printable by the print bureau systems 204, the 3D model may have to satisfy certain criteria. Although a 3D model may appear to be printable to a user, the 3D model may include small errors that cause problems for 3D printing software, even though the problem does is not readily apparent to the user based on viewing the 3D model within the user's 3D design tool. For example, if the 3D model does not represent a closed volume, the 3D model may not be printable. A 3D model will not represent a closed volume if a portion of the 3D model's surface is undefined. The undefined portion of the model may be referred to as a hole and may be caused by a failure of the 3D mesh to cover the entire surface of the intended 3D volume. Such a 3D model may not be printable because the 3D printing software may not be able to interpret the 3D model.

Additionally, the 3D model may not be printable if the 3D model does not represent a true volume. For example, in some 3D CAD packages, depending on how features of the 3D model are defined, it may be possible to generate a 3D model that represents a negative volume. The 3D model would appear normal to the user, but may be unprintable. Additionally, if the faces of the 3D model are not oriented properly, the 3D model may not be printable. For example, each face should be oriented such that the face points outward from the surface of the 3D model. If a face is incorrectly defined as pointing inward, the 3D model may not be printable.

The printability check engine 222 can be used to determine whether a 3D model received from the client is printable. For example, printability check engine 222 can automatically determine whether the 3D model represents a true, closed volume, and whether the faces are oriented properly. The printability check engine 222 can also automatically determine whether texture data representing color is included in the 3D model and is valid, and whether certain meta data, such as scale, are specified. The printability check engine 222 can also determine whether the 3D model includes features that are difficult to print, such as features that are too small to be printed successfully based on the capabilities of the print bureaus 204. If the printability check engine 222 determines that the 3D model is not printable, the printability check engine 222 can trigger a number of responses, such as sending a message to the client system 202 to alert the client that the 3D model is not printable and identify the reasons why the 3D model is not printable. Depending on the nature of the problem, the printability check engine 222 may launch the model repair engine 224, which can attempt to fix the 3D model. For example, if the 3D model is not a closed volume, the model repair engine 224 can attempt to repair any holes that may exist on the surface of the 3D model by connecting mesh vertices. If the 3D model is not a true volume, the model repair engine 224 can re-define certain features of the model to make it a true volume. If one or more faces of the 3D model are not oriented correctly, the model repair engine 224 can change the orientation of the faces that are improperly oriented.

The print optimization engine 226 can also modify the 3D model to improve printability. For example, the print optimization engine 226 can create drain holes for inert material to be removed from the interior of closed objects. Depending on the shape and orientation of the 3D model, some features may be difficult to print without also printing sufficient support material. For example, a portion of a 3D model that overhangs empty space may generally be printed on top of support material, which may be removed after printing. The print optimization engine 226 can add support material to the 3D model to enable the printing of objects with sharp angled overhangs. The print optimization engine 226 can also modify the 3D model to reduce the amount of material used during printing. Depending on the shape and orientation of the 3D model, the print optimization engine 226 may be able to change the orientation of the 3D model to reduce or even eliminate the support material used during printing. Additionally, the print optimization engine 226 may also be able to reduce the amount of print material consumed by creating a hollow space inside the 3D model.

The print bureau filter 228 identifies the print bureaus that are able to print the 3D model received from the client system 202. The print bureau filter 228 can identify the print bureaus based on comparing characteristics of the 3D model with capabilities of the print bureau. The capabilities of each print bureau 204 may relate to the largest size of printable object, the printing materials that can be incorporated into the printed object, and the smallest feature size that can be printed, among others. The print bureau filter 228 can be filtered out any print bureaus 204 that are unable to print the 3D model.

The print ordering interface 230 can present the remaining print bureaus 204 that have not been filtered out as options for the client. The print ordering interface 230 can also provide other information to the client system 202 for each print bureau, such as pricing information, location, contact information, and the like. When the client selects a print bureau, the print ordering interface 230 can connect the client system 202 to the selected print bureau 204 to complete the order. The print ordering interface 230 can route the user to the selected print bureau 204 by providing a URL to the client system 202, for example.

The telemetry collection engine 232 can be used to collect data regarding the use of the 3D print Web broker system 200 by clients. For example, the telemetry collection engine 232 can collect a history of print jobs submitted to each print bureau. The data can be analyzed to determine statistical data such as which print bureaus are used more often, what types of 3D model problems tend to occur more frequently, how many orders each print bureau receives, the most common 3D model file formats used by clients, and others.

Figure 3:
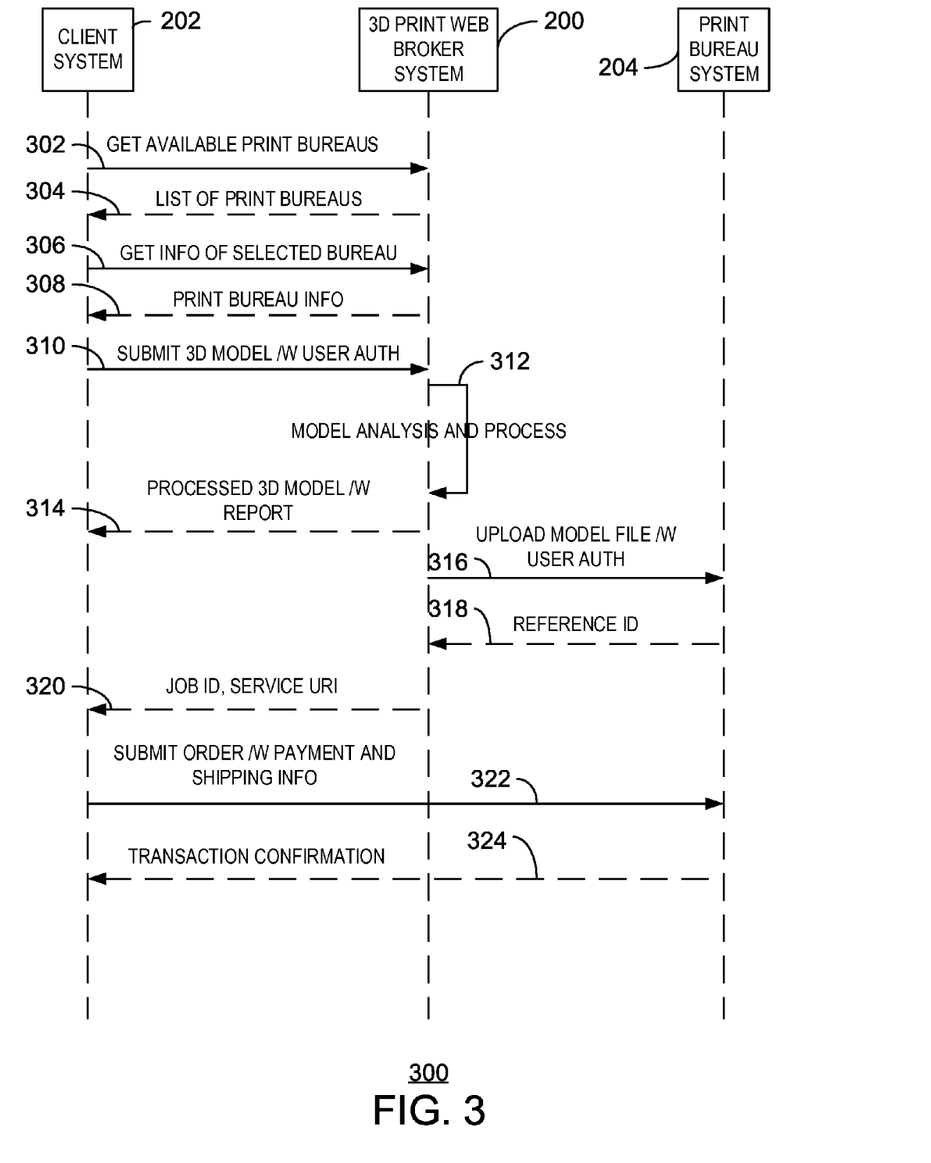
FIG. 3 is a sequence diagram showing an example process for ordering a 3D print through a 3D print Web Broker system.

FIG. 3 is a sequence diagram showing an example process for ordering a 3D print through a 3D print Web Broker system. In the sequence diagram 300 shown in FIG. 3, requests are shown with solid lines and responses are shown with dotted lines. The process 300 may begin when the client system 202 sends a request 302 for available print bureaus to the Web broker system 200. In response to the request 302, the Web Broker system 200 sends a list of available print bureaus to the client system 202 in the response 304.

The client may then select a print bureau and the client system 202 send a request 306 for additional information about the selected print bureau, such as print capabilities, geographical location, and pricing, among others. In response to the request 306, the Web Broker system 200 provides the requested information in the response 308. The client system 202 can send a print job request 310, which includes the submitted 3D model and user authorization credentials for the Web broker system 200. The user authorization credentials provided by the client system 202 enable the Web broker system 200 to identify the user and obtain stored data about the user.

Upon receipt of the 3D model, the Web broker system 200 can initiate process 312. During process 312, the Web broker system 200 can analyze and process the 3D model as describe above in relation to FIG. 2. For example, the Web broker system 200 can perform a printability check, attempt automatic repair, and attempt to optimize the model to reduce printing cost. The Web broker system 200 can also translate the 3D model into the file format accepted by the selected print bureau. During process 312 the Web broker system 200 can obtain user authorization credentials to be used at the selected print bureau 204 on behalf of the client. For example, the user authorization credentials can be obtained from as storage device accessible to the Web broker system 200. Thus, the user authorization credentials received from the client system 202 may be different from the user authorization credentials applied at the print bureau system 204 by the Web broker system 200.

The Web broker system 200 then sends a response 314 that indicates the result of the 3D model analysis and processing. The response 314 can also include the processed 3D model, which may have been modified to correct defects, for example. The response 314 can also include a report that can indicates various information about the 3D model, such as whether the model is printable, whether any modifications were made, and the cost to generate a print out of the 3D model.

The Web broker system 200 also sends a print job request 316 to the print bureau system 204 of the selected print bureau. The print job request 316 can include the processed 3D model and the user authorization credentials obtained by the Web broker system 200 during process 312. In response to the print job request 316, the print bureau system 204 provides a response 318 that includes a reference identifier that identifies the print job. After receiving the reference identifier, the Web broker system 200 sends a response 320 to the client system 202, the response 320 including the reference identifier and a redirect URL that that enables the client to be rerouted to a Web page of the print bureau system 204 for completion of the print job order. The client system 202 then sends a print job request 322 directly to the print bureau system 204. The print job request 322 can include payment information, shipping information, number of copies ordered, material, and other types of information. In response to the print job request 322, the print bureau system 204 sends a transaction confirmation response 324 directly to the client system 202.

The process described in FIG. 3 is one example of a process in accordance with the present techniques. An implementation of the techniques may include fewer actions or additional actions not shown. Furthermore, the actions shown in FIG. 3 could occur in a different order than the order suggested in FIG. 3.

Figure 4:
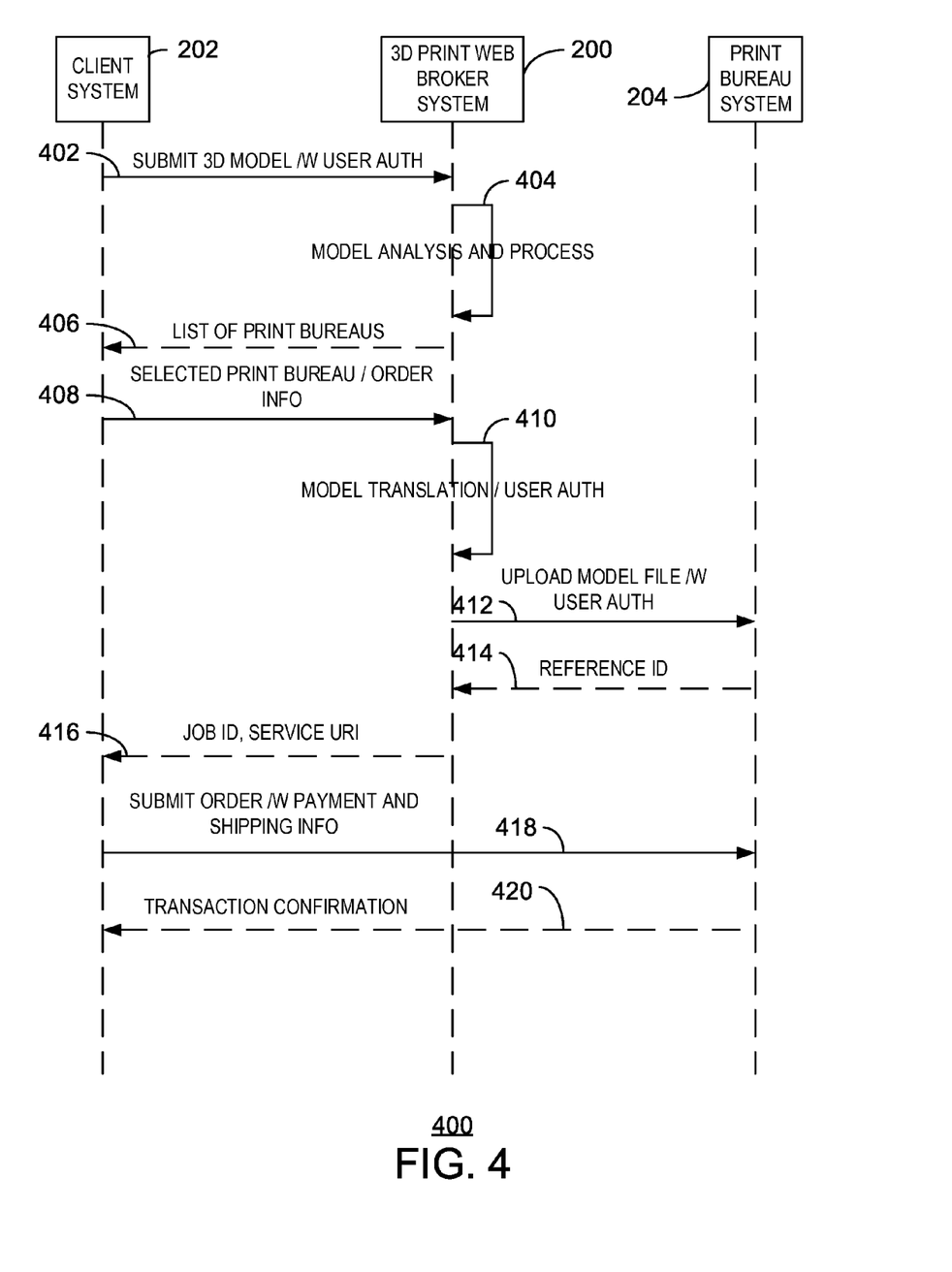
FIG. 4 is a sequence diagram showing another example process for ordering a 3D print through a 3D print Web Broker system.

FIG. 4 is a sequence diagram showing another example process for ordering a 3D print through a 3D print Web Broker system. In the sequence diagram 400 shown in FIG. 4, requests are shown with solid lines and responses are shown with dotted lines. The process 400 may begin when the client system 202 sends a request 402 to the Web broker system 200. The request 402 is a request to begin the 3D print ordering process. The request can include the 3D model and a user authorization that enables the Web broker system 200 to identify the user.

In response to the request 402, the Web broker system 200 can initiate process 404. During process 404, the Web broker system 200 can analyze and process the 3D model as describe above in relation to FIG. 2. For example, the Web broker system 200 can perform a printability check, attempt automatic repair, and attempt to optimize the model to reduce printing cost. The Web broker system 200 can also use the characteristics of the 3D model to identify suitable print bureaus. The characteristics of the model used to identify print bureaus can include model materials, model size, size of the smallest feature, colors, and the like. The 3D model characteristics can be compared to the print bureau information to identify print bureaus capable of printing the object.

The Web broker system 200 then sends a list of available print bureaus to the client system 202 in the response 406. In this way, the print bureaus unable to print the object are automatically eliminated from consideration. The response 406 can also include additional information about the print bureaus, such as name, geographical location, pricing information, wait time, and the like. Based on this information, the client can select one of the print bureaus to place an order.

If the user chooses to place an order, the client system 202 sends a print job request 408 to the Web broker system 200, which indicates the selected print bureau 204 and may provide additional order information, such as number of 3D prints ordered. In response to the request 408, the Web broker system 200 can initiate process 410. During process 410, the Web broker system 200 translates the 3D model into the file format accepted by the selected print bureau 204. The Web broker system 200 may also obtain user authorization credentials to be used at the selected print bureau 204 on behalf of the client.

After translating the 3D model to a suitable format, the Web broker system 200 sends a print job request 412 to the print bureau system 204 of the selected print bureau. The print job request 412 can include the processed 3D model generated during process 404 and the user authorization credentials obtained by the Web broker system 200 during process 410. In response to the print job request 412, the print bureau system 204 provides a response 414 that includes a reference identifier that identifies the print job. After receiving the reference identifier, the Web broker system 200 sends a response 416 to the client system 202, the response 416 including the reference identifier and a redirect URL that that enables the client to be rerouted to a Web page of the print bureau system 204 for completion of the print job order. The client system 202 then sends a print job request 418 directly to the print bureau system 204. The print job request 418 can include payment information, shipping information, number of copies ordered, material, and other types of information. In response to the print job request 418, the print bureau system 204 sends a transaction confirmation response 420 directly to the client system 202.

The process described in FIG. 4 is one example of a process in accordance with the present techniques. An implementation of the techniques may include fewer actions or additional actions not shown. Furthermore, the actions shown in FIG. 4 could occur in a different order than the order suggested in FIG. 4.

Figure 5:
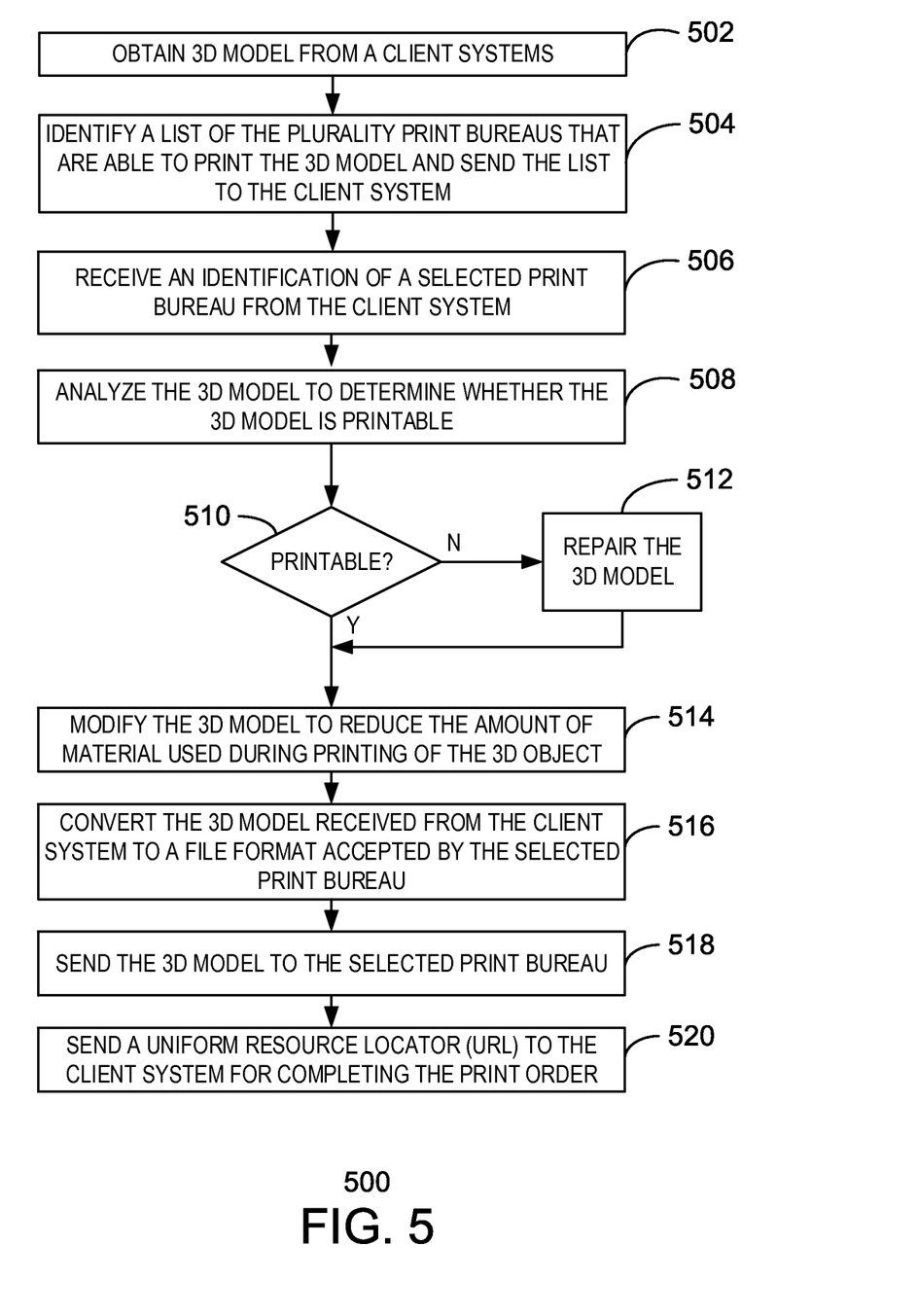
FIG. 5 is a process flow diagram summarizing a method of operating a printing service.

FIG. 5 is a process flow diagram summarizing a method of operating a printing service. One or more components of hardware or software of the operating environment 100, may be configured to perform the method 500. In some examples, various aspects of the method may be performed in a cloud computing system. The method 500 may begin at block 502.

At block 502 a 3D model is obtained. The 3D model may be obtained from a client system over a network such as the Internet, for example. The 3D model may be a mesh model that includes a mesh of polygons such as triangles, or any other suitable type of 3D model.

At block 504, a list of plurality print bureaus that are able to print the 3D model is obtained and sent to the client system. The list can be obtained by comparing characteristics of the 3D model with capabilities of a plurality of print bureaus.

At block 506, an identification of a selected print bureau is received from the client system. The selected print bureau is the print bureau that the client has chosen for ordering the 3D print.

At block 508, the 3D model is analyzed to determine whether the 3D model is printable. For example, as discussed above, determining whether the 3D model is printable can include determining whether the 3D model represents a closed volume, a true volume, and whether all of the faces are correctly oriented. Determining whether the 3D model is printable can also include determining whether the scale of the 3D model is too large or whether there are features that are too small to print correctly.

If the 3D model is not printable, the process flow advances from block 510 to block 512. At block 512, the 3D model is modified to correct any detected defects in the 3D model. For example, correcting defects may include connecting vertices of the 3D model to generate a closed volume, changing the orientation of faces, correcting 3D model meta-data such as scale or the material designations of the 3D model, among others. After the 3D model is repaired, the process flow advances to block 514. If, at block 510, the 3D model is printable, the process flow advances from block 510 to block 514 directly and block 512 is skipped.

At block 514, the 3D model can be modified to reduce the amount of material used during printing of the 3D object. For example, as described above, a hollow space can be created within the 3D model, drain holes can be added, support structures can be added, and the orientation of the 3D model can be changed.

At block 516, the 3D model is converted into the file format that was received from the client system into a format accepted by the selected print bureau.

At block 518, the 3D model is sent to the selected print bureau.

At block 520, a Uniform Resource Locator (URL) is sent to the client system. The URL identifies a resource of the selected print bureau that enables a user of the client system to complete a print order. The client may then communicate directly with the selected print bureau to complete the order.

This process flow diagram is not intended to indicate that the blocks of the method 400 are to be executed in any particular order, or that all of the blocks are to be included in every case. Further, any number of additional blocks not shown may be included within the method 400, depending on the details of the specific implementation.

EXAMPLE 1

An example system for printing a three-dimensional (3D) object is provided. The system includes a first network interface to obtain a 3D model from a client system. The system also includes a print bureau data collection engine to identify capabilities of a plurality of print bureaus. The system also includes a print bureau filter to compare characteristics of the 3D model with capabilities of the plurality of print bureaus to identify a subset of the plurality print bureaus that are able to print the 3D model and send the subset to the client system via the first network interface.

In some implementations, the system can include a second network interface to send the 3D model to a selected print bureau, and the first network interface can be used to send to the client system a link to a resource of the selected print bureau that enables completion of a print order. Alternatively, or in addition to the second network interface, the system can include a format conversion engine to convert the 3D model received from the client system to a file format accepted by the selected print bureau. Alternatively, or in addition to any of the above implementations, the system can include a user sign-on engine to receive a first user authentication from the client system and provides a login token to the selected print bureau.

Alternatively, or in addition to any of the above implementations, the system can include a printability check engine to automatically process the 3D model to determine if the model is printable. In some implementations, the printability check engine is to determine whether the 3D model includes features that are too small to print successfully. Alternatively, or in addition, the printability check engine is to determine whether the 3D model is a closed volume. Alternatively, or in addition, the printability check engine is to determine whether the 3D model represents a true volume. Alternatively, or in addition, the printability check engine is to determine whether each face of the 3D model is correctly oriented.

Alternatively, or in addition to any of the above implementations, the system can include a model repair engine to modify the 3D model to correct any detected defects in the 3D model. Alternatively, or in addition to any of the above implementations, the system can include a print optimization engine to modify the 3D model to reduce the amount of material used during printing of the 3D object. The print optimization engine can automatically create a hollow space inside a closed volume of the 3D model, and can also automatically create a drain hole coupling the hollow space to an external surface of the 3D volume.

EXAMPLE 2

Another example system for printing a three-dimensional (3D) object is provided. The example system includes a processor and a system memory comprising code to direct the actions of the processor. The code directs the processor to obtain a 3D model from a client system and determine whether the 3D model represents a closed volume. If the 3D model does not represent a closed volume, the code directs the processor to automatically repair the 3D model to generate a modified 3D model with a closed volume.

In some implementations, the system memory includes code to direct the processor to send the 3D model to a 3D printer for fabrication via a Local Area Network (LAN). Alternatively, or in addition to any of the above implementations, the system memory can include code to direct the processor to send the modified 3D model to a print bureau through the Internet and send a Uniform Resource Locator (URL) to the client system, wherein the URL identifies a resource of the print bureau that enables a user of the client system to complete a print order. Alternatively, or in addition to any of the above implementations, the system memory can include code to direct the processor to convert the 3D model received from the client system to a file format accepted by the print bureau. Alternatively, or in addition to any of the above implementations, the system can include code to direct the processor to receive a first user authentication from the client system and provides a login token to the selected print bureau.

Alternatively, or in addition to any of the above implementations, the system memory can include code to direct the processor to determine whether the 3D model includes features that are too small to print successfully and/or determine whether the 3D model represents a true volume. Alternatively, or in addition to any of the above implementations, the system memory can include code to direct the processor to determine whether each face of the 3D model is correctly oriented. For any face of the 3D model that is not correctly oriented, the code can direct the processor to change the orientation of the face.

Alternatively, or in addition to any of the above implementations, the system memory can include code to direct the processor to automatically create a hollow space inside a closed volume of the 3D model. The system memory can also include code to direct the processor to automatically create a drain hole coupling the hollow space to an external surface of the 3D volume.

EXAMPLE 3

An example method for printing a three-dimensional (3D) object is provided. The example method includes obtaining a 3D model from a client system and comparing characteristics of the 3D model with capabilities of a plurality of print bureaus to identify a subset of the plurality print bureaus that are able to print the 3D model. The method also includes sending the subset to the client system.

In some implementations, the example method can include receiving an identification of a selected print bureau from the client system and sending the 3D model to the selected print bureau. The example method can also include sending a Uniform Resource Locator (URL) to the client system, wherein the URL identifies a resource of the selected print bureau that enables a user of the client system to complete a print order. Alternatively, or in addition to any of the above implementations, the method can include receiving a first user authentication from the client system and providing a login token to the selected print bureau.

Alternatively, or in addition to any of the above implementations, the method can include converting the 3D model received from the client system to a file format accepted by the selected print bureau. Alternatively, or in addition to any of the above implementations, the method can include automatically processing the 3D model to determine if the 3D model is printable. Processing the 3D model to determine if the 3D model is printable can include any one or more of the following: determining whether the 3D model includes features that are too small to print successfully; determining whether the 3D model is a closed volume; determining whether the 3D model represents a true volume; and determining whether each face of the 3D model is correctly oriented. The method can include modifying the 3D model to correct any detected defects in the 3D model before sending the 3D model to the selected print bureau.

Alternatively, or in addition to any of the above implementations, the method can include modifying the 3D model to reduce the amount of material used during printing of the 3D object before sending the 3D model to the selected print bureau. Modifying the 3D model to reduce the amount of material can include automatically creating a hollow space inside a closed volume of the 3D model and, optionally, creating a drain hole coupling the hollow space to an external surface of the 3D volume. Alternatively, or in addition to any of the above implementations, modifying the 3D model to reduce the amount of material can include automatically changing the orientation of the 3D model.

EXAMPLE 4

Another example system for printing a three-dimensional (3D) object is provided. The example system includes means for obtaining a 3D model from a client system and means for comparing characteristics of the 3D model with capabilities of a plurality of print bureaus to identify a subset of the plurality print bureaus that are able to print the 3D model. The system also includes means for sending the subset to the client system.

In some implementations, the example system can include means for receiving an identification of a selected print bureau from the client system and means for sending the 3D model to the selected print bureau. The example system can also include means for sending a Uniform Resource Locator (URL) to the client system, wherein the URL identifies a resource of the selected print bureau that enables a user of the client system to complete a print order. Alternatively, or in addition to any of the above implementations, the system can include means for receiving a first user authentication from the client system and providing a login token to the selected print bureau.

Alternatively, or in addition to any of the above implementations, the system can include means for converting the 3D model received from the client system to a file format accepted by the selected print bureau. Alternatively, or in addition to any of the above implementations, the system can include means for automatically processing the 3D model to determine if the 3D model is printable. The means for processing the 3D model to determine if the 3D model is printable can include any one or more of the following: means for determining whether the 3D model includes features that are too small to print successfully; means for determining whether the 3D model is a closed volume; means for determining whether the 3D model represents a true volume; and means for determining whether each face of the 3D model is correctly oriented. The system can also include means for modifying the 3D model to correct any detected defects in the 3D model before sending the 3D model to the selected print bureau.

Alternatively, or in addition to any of the above implementations, the system can include means for modifying the 3D model to reduce the amount of material used during printing of the 3D object before sending the 3D model to the selected print bureau. The means for modifying the 3D model to reduce the amount of material can include means for automatically creating a hollow space inside a closed volume of the 3D model and, optionally, means for creating a drain hole coupling the hollow space to an external surface of the 3D volume. Alternatively, or in addition to any of the above implementations, the means for modifying the 3D model to reduce the amount of material can include means for automatically changing the orientation of the 3D model.

What has been described above includes examples of the claimed subject matter. It is, of course, not possible to describe every conceivable combination of components or methodologies for purposes of describing the claimed subject matter, but one of ordinary skill in the art may recognize that many further combinations and permutations of the claimed subject matter are possible. Accordingly, the claimed subject matter is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component, e.g., a functional equivalent, even though not structurally equivalent to the disclosed structure, which performs the function in the herein illustrated exemplary aspects of the claimed subject matter. In this regard, it will also be recognized that the innovation includes a system as well as a computer-readable storage media having computer-executable instructions for performing the acts and events of the various methods of the claimed subject matter.

There are multiple ways of implementing the claimed subject matter, e.g., an appropriate API, tool kit, driver code, operating system, control, standalone or downloadable software object, etc., which enables applications and services to use the techniques described herein. The claimed subject matter contemplates the use from the standpoint of an API (or other software object), as well as from a software or hardware object that operates according to the techniques set forth herein. Thus, various implementations of the claimed subject matter described herein may have aspects that are wholly in hardware, partly in hardware and partly in software, as well as in software.

The aforementioned systems have been described with respect to interaction between several components. It can be appreciated that such systems and components can include those components or specified sub-components, some of the specified components or sub-components, and additional components, and according to various permutations and combinations of the foregoing. Sub-components can also be implemented as components communicatively coupled to other components rather than included within parent components (hierarchical).

Additionally, it can be noted that one or more components may be combined into a single component providing aggregate functionality or divided into several separate sub-components, and any one or more middle layers, such as a management layer, may be provided to communicatively couple to such sub-components in order to provide integrated functionality. Any components described herein may also interact with one or more other components not specifically described herein but generally known by those of skill in the art.

In addition, while a particular feature of the claimed subject matter may have been disclosed with respect to one of several implementations, such feature may be combined with one or more other features of the other implementations as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

What is claimed is:

1. A system for fabricating a three-dimensional (3D) object comprising:
    a first network interface to:
        obtain user authorization credentials and a 3D model of the 3D object from a client system via a network, wherein the 3D model is generated by a 3D design tool residing on the client system and the user authorization credentials are provided by a user of the client system;
    a second network interface to:
        receive, from a selected print bureau via the network, a reference identifier identifying a job to fabricate the 3D object using a resource of the selected print bureau, wherein the resource of the selected print bureau fabricates the 3D object in response to receiving a request from the client system; and
    a processor to:
        authenticate the user authorization credentials;
        identify capabilities of a plurality of print bureaus;
        compare characteristics of the 3D model with the identified capabilities of the plurality of print bureaus to identify a subset of the plurality print bureaus that are able to fabricate the 3D object from the 3D model;
        send a list of the subset to the client system via the first network interface;
        receive an identity of the selected print bureau via the first network interface, the selected print bureau being a member of the subset;
        generate log-in information that conforms with rules specific to the selected print bureau based on the authenticated user authorization credentials; and
        send the 3D model and the log-in information to the selected print bureau via the second network interface.

2. The system of claim 1, wherein the first network interface is to further:
    send to the client system a link to the resource of the selected print bureau.

3. The system of claim 1, wherein the processor is to further:
    convert the 3D model received from the client system to a file format accepted by the selected print bureau.

4. The system of claim 1, wherein the processor is to further:
    determine whether the 3D model includes features that are too small for the 3D object to be fabricated successfully.

5. The system of claim 1, wherein the processor is to further:
    determine whether the 3D model is a closed volume.

6. The system of claim 1, wherein the processor is to further:
    determine whether the 3D model represents a true volume.

7. The system of claim 1, wherein the processor is to further:
    determine whether each face of the 3D model is correctly oriented.

8. The system of claim 1, wherein the processor is to further:
    modify the 3D model to reduce an amount of material used during fabrication of the 3D object.

9. A system comprising:
    a processor;
    a first network interface to:
        obtain user authorization credentials and a 3D model of a 3D object from a client system via a network, wherein the 3D model is generated by a 3D design tool residing on the client system and the user authorization credentials are provided by a user of the client system;
    a second network interface to:
        receive, from a selected print bureau via the network, a reference identifier identifying a job to fabricate the 3D object using a resource of the selected print bureau, wherein the resource of the selected print bureau fabricates the 3D object in response to receiving a request from the client system; and
    a system memory comprising code to direct the processor to:
        authenticate the user authorization credentials;
        determine whether the 3D model represents a closed volume;
        if the 3D model does not represent the closed volume, then automatically repair the 3D model to generate a modified 3D model representing the closed volume;
        identify capabilities of a plurality of print bureaus;
        compare characteristics of the modified 3D model with the identified capabilities of the plurality of print bureaus to identify a subset of the plurality print bureaus that are able to fabricate the 3D object from the modified 3D model;
        send a list of the subset to the client system via the first network interface;
        receive an identity of the selected print bureau via the first network interface, the selected print bureau being a member of the subset;
        generate log-in information that conforms with rules specific to the selected print bureau based on the authenticated user authorization credentials; and
        send the modified 3D model and the log-in information to the selected print bureau via the second network interface.

10. The system of claim 9, the system memory comprising code to direct the processor to:
    send the modified 3D model to the selected print bureau through the Internet via the second network interface; and
    send a Uniform Resource Locator (URL) to the client system via the first network interface, wherein the URL identifies the resource of the selected print bureau.

11. The system of claim 10, the system memory comprising code to direct the processor to further:
    convert the 3D model received from the client system to a file format accepted by the selected print bureau.

12. The system of claim 9, the system memory comprising code to direct the processor to further:
    determine whether the 3D model includes features that are too small for the 3D object to be fabricated successfully.

13. The system of claim 9, the system memory comprising code to direct the processor to further:
   determine whether the 3D model represents a true volume.

14. The system of claim 9, the system memory comprising code to direct the processor to further:
   determine whether each face of the 3D model is correctly oriented; and
   for any face of the 3D model that is not correctly oriented, change the orientation of the face.

15. The system of claim 9, the system memory comprising code to direct the processor to further:
   automatically create a hollow space inside a closed volume of the 3D model.

16. The system of claim 9, the system memory comprising code to direct the processor to further:
   automatically create a drain hole coupling a hollow space to an external surface of a 3D volume.

17. A method, comprising:
obtaining user authorization credentials and a three-dimensional (3D) model of a 3D object from a client system via a first network interface, wherein the 3D model is generated by a 3D design tool residing on the client system and the user authorization credentials are provided by a user of the client system;
comparing characteristics of the 3D model with capabilities of a plurality of print bureaus to identify a subset of the plurality print bureaus that are able to fabricate the 3D object from the 3D model;
sending a list of the subset to the client system via the first network interface;
receiving an identification of a selected print bureau from the list from the client system via the first network interface;
authenticating the user authorization credentials;
generating log-in information that conforms with rules specific to the selected print bureau based on the authenticated user authorization credentials;
sending the 3D model and the log-in information to the selected print bureau via a second network interface;
receiving, from the selected print bureau via the second network interface, a reference identifier identifying a job to fabricate the 3D object using a resource of the selected print bureau, wherein the resource of the selected print bureau fabricates the 3D object in response to receiving a request from the client system.

18. The method of claim 17, further comprising:
sending a Uniform Resource Locator (URL) to the client system via the first network interface, wherein the URL identifies the resource of the selected print bureau.

19. The method of claim 18, further comprising:
converting the 3D model received from the client system to a file format accepted by the selected print bureau.

20. The method of claim 18, further comprising:
modifying the 3D model to reduce an amount of material used during fabrication of the 3D object before sending the modified 3D model to the selected print bureau.

* * * * *